(12) United States Patent
Okumura et al.

(10) Patent No.: US 10,026,677 B2
(45) Date of Patent: Jul. 17, 2018

(54) SEMICONDUCTOR DEVICE

(71) Applicant: KABUSHIKI KAISHA TOSHIBA, Minato-ku, Tokyo (JP)

(72) Inventors: Naohisa Okumura, Kanagawa (JP); Yasuhisa Shintoku, Kanagawa (JP); Tetsuya Kurosawa, Kanagawa (JP); Hiroaki Kishi, Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 15/252,915

(22) Filed: Aug. 31, 2016

(65) Prior Publication Data
US 2017/0250124 A1   Aug. 31, 2017

(30) Foreign Application Priority Data
Feb. 29, 2016   (JP) .................. 2016-037102

(51) Int. Cl.
*H01L 23/495* (2006.01)
*H01L 23/00* (2006.01)
(Continued)

(52) U.S. Cl.
CPC .... *H01L 23/49503* (2013.01); *H01L 21/4842* (2013.01); *H01L 23/49537* (2013.01); *H01L 23/49541* (2013.01); *H01L 23/49568* (2013.01); *H01L 24/32* (2013.01); *H01L 24/49* (2013.01); *H01L 24/73* (2013.01); *H01L 24/83* (2013.01); *H01L 24/85* (2013.01); *H01L 24/92* (2013.01); *H01L 24/97* (2013.01); *H01L 21/561* (2013.01); *H01L 23/3107* (2013.01); *H01L 24/48* (2013.01); *H01L 2224/29139* (2013.01); *H01L 2224/32245* (2013.01); *H01L 2224/45144* (2013.01); *H01L 2224/45147* (2013.01); *H01L 2224/48091* (2013.01); *H01L 2224/48177* (2013.01);
(Continued)

(58) Field of Classification Search
None
See application file for complete search history.

(56) References Cited

U.S. PATENT DOCUMENTS 5,214,846 A * 6/1993 Asami ................... H01L 21/565
                                                           257/735
6,081,029 A * 6/2000 Yamaguchi ........... H01L 21/561
                                                           257/666
(Continued)

FOREIGN PATENT DOCUMENTS

JP       05-136320 A    6/1993
JP       06-140563 A    5/1994
JP       4207791 B2     1/2009

*Primary Examiner* — Eva Y Montalvo
*Assistant Examiner* — Kevin Quinto
(74) *Attorney, Agent, or Firm* — Foley & Lardner LLP (57) ABSTRACT

A semiconductor device that includes a first die pad, an adhesive, and a second die pad fixed to the top surface of the first die pad via the adhesive. The second die pad includes a body portion and a protrusion portion provided on a side surface of the body portion. A semiconductor chip is fixed to a top surface of the second die pad, and a lead is electrically connected to the semiconductor chip. The semiconductor device further includes a package material that covers the first die pad, the second die pad, the semiconductor chip, and the lead. The first die pad is substantially as thick as the lead.

17 Claims, 8 Drawing Sheets

(51) Int. Cl.
*H01L 21/48* (2006.01)
*H01L 23/31* (2006.01)
*H01L 21/56* (2006.01)

(52) U.S. Cl.
CPC ............ *H01L 2224/48247* (2013.01); *H01L 2224/49171* (2013.01); *H01L 2224/73265* (2013.01); *H01L 2224/92247* (2013.01); *H01L 2224/97* (2013.01); *H01L 2924/1033* (2013.01); *H01L 2924/1306* (2013.01); *H01L 2924/17747* (2013.01)

(56) References Cited

U.S. PATENT DOCUMENTS

| | | |
|---|---|---|
| 7,312,511 B2 | 12/2007 | Danno et al. |
| 7,821,117 B2 | 10/2010 | Brown et al. |
| 7,834,431 B2 | 11/2010 | Hooper et al. |
| 8,334,584 B2 | 12/2012 | Camacho et al. |
| 9,142,479 B2 | 9/2015 | Kawano et al. |
| 2012/0061813 A1* | 3/2012 | Ho .................... H01L 23/49524 257/676 |
| 2016/0300781 A1* | 10/2016 | Xue ...................... H01L 23/043 |

* cited by examiner

FIG. 9B ary summary and the following detailed description are not meant to restrict the disclosure

SEMICONDUCTOR DEVICE

CROSS-REFERENCE TO RELATED APPLICATION

This application claims the benefit of and priority to Japanese Patent Application No. 2016-037102, filed Feb. 29, 2016, the entire contents of which are incorporated herein by reference.

FIELD

Embodiments described herein relate generally to a semiconductor device.

BACKGROUND

In a semiconductor device including a die pad as a mounting portion of a semiconductor chip, in which the semiconductor chip and the die pad are covered with a package material, it is important to discharge a Joule heat generated by a current flowing into the semiconductor chip efficiently to the outside of the semiconductor device.

As an approach for achieving a good heat radiation property, the die pad made of metal, serving as a heat radiating plate as well as a mounting portion, may be enlarged in a horizontal direction, to reduce the thermal resistance of the die pad. This approach, however, is disadvantageous in that it enlarges the size of the semiconductor device in the horizontal direction, making the die pad less compact.

As another approach for achieving a good heat radiation property, the die pad made of metal may be thickened to reduce the thermal resistance of the die pad. This approach, however, is not practical because micro fabrication of a thick metal plate is difficult.

SUMMARY

In some embodiments according to one aspect, a semiconductor device includes a first die pad, an adhesive, and a second die pad fixed to the top surface of the first die pad via the adhesive. The second die pad includes a body portion and a protrusion portion provided on a side surface of the body portion. A semiconductor chip is fixed to a top surface of the second die pad, and a lead is electrically connected to the semiconductor chip. The semiconductor device further includes a package material that covers the first die pad, the second die pad, the semiconductor chip, and the lead. The first die pad is substantially as thick as the lead.

In some embodiments according to another aspect, a method of manufacturing a semiconductor device includes providing a lead frame including a first die pad and a plurality of leads. The method further includes affixing a second die pad on a top surface of the first die pad, the second die pad including a body portion and a protrusion portion extending from a side surface of the body portion. The method further includes affixing a semiconductor chip to a top surface of the second die pad, electrically connecting the semiconductor chip and the leads, and covering the lead frame, the second die pad, and the semiconductor chip with a package material.

Other aspects and embodiments of the disclosure are also encompassed. The foregoing summary and the following detailed description are not meant to restrict the disclosure to any particular embodiment but are merely meant to describe some embodiments of the disclosure.

DETAILED DESCRIPTION

In general, according to some embodiments, the devices and methods described herein may provide a semiconductor device with a good heat radiation property.

Some embodiments of a semiconductor device can include a first die pad having a top surface, and a second die pad fixed to the top surface of the first die pad via an adhesive. The second die pad can include a body portion having at least one side surface, and a protrusion portion provided on the at least one side surface of the body portion. A semiconductor chip can be fixed to a top surface of the second die pad, and a lead can be electrically connected to the semiconductor chip. The semiconductor device can further include a package material that covers at least a portion of the first die pad, at least a portion of the second die pad, at least a portion of the semiconductor chip, and at least a portion of the lead. The first die pad can be substantially as thick as the lead.

Hereinafter, the semiconductor device according to various embodiments will be specifically described with reference to the drawings.

First Embodiment

Figure 1A:
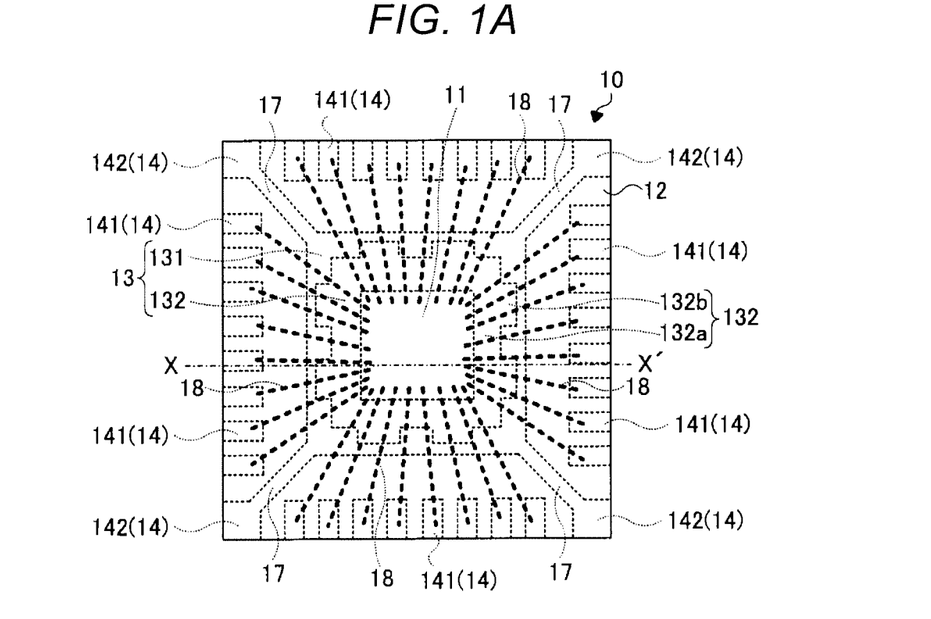
FIG. 1A is a top view schematically showing a semiconductor device according to a first embodiment.
Figure 1B:
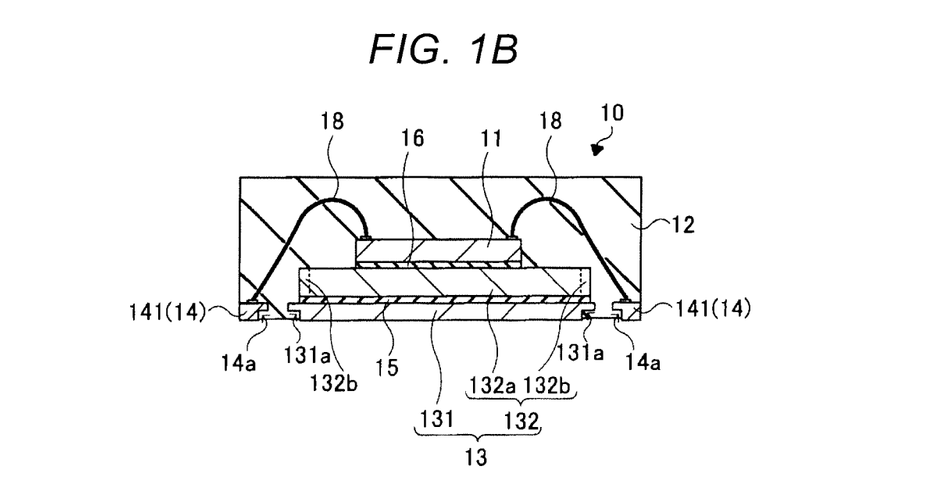
FIG. 1B is a cross-sectional view of the semiconductor device taken along a dashed line X-X' in FIG. 1A.
Figure 1C:
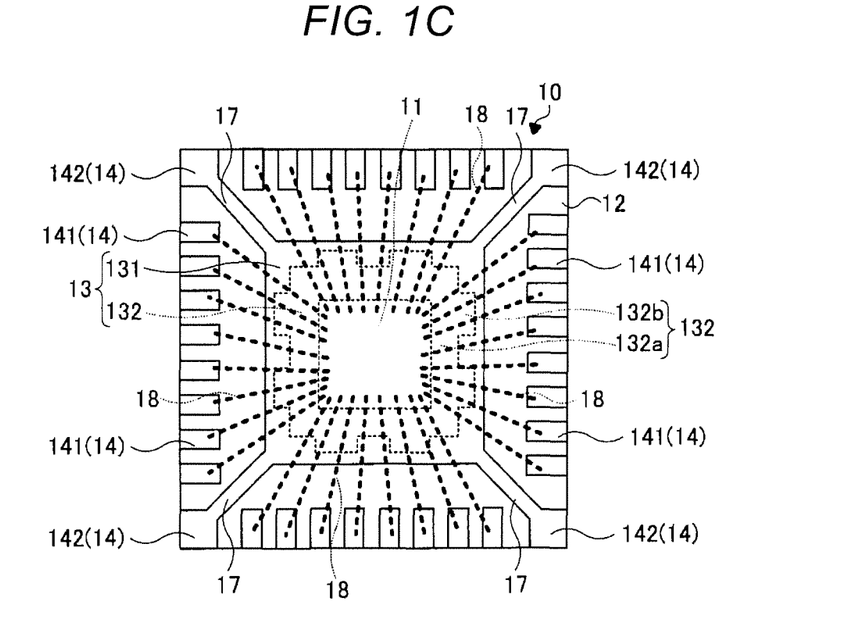
FIG. 1C is a bottom view schematically showing the semiconductor device according to the first embodiment.

FIG. 1A is a top view schematically showing a semiconductor device according to the first embodiment. FIG. 1B is a cross-sectional view of the semiconductor device taken along a dashed line X-X' in FIG. 1A. FIG. 1C is a bottom view schematically showing the semiconductor device according to the first embodiment.

As shown in FIGS. 1A, 1B, and 1C, a semiconductor device 10 according to the first embodiment includes a semiconductor chip 11 and a package material 12 covering the semiconductor chip 11.

The semiconductor chip 11 may be a semiconductor device capable of handling a large electric power, such as a gallium nitride-field effect transistor ("GaN-FET") device that can amplify the power of a high frequency signal.

The semiconductor chip 11 is mounted on a die pad portion 13. The die pad portion 13 can serve as the mounting portion of the semiconductor chip 11 and simultaneously can serve as a heat radiating plate for dissipating Joule heat generated in the semiconductor chip 11.

The die pad portion 13 includes a first die pad 131 and a second die pad 132 fixed on the top surface of the first die pad 131.

The first die pad 131 is a rectangular plate formed of, for example, a metal material having superior thermal conductivity. The metal may include copper (Cu), or may include a copper alloy, or may include another appropriate metal or alloy. The first die pad 131 can be processed together with a plurality of leads 14, as described below. In the depicted embodiment, a thickness of the first die pad 131 is substantially the same as, or equal to, a thickness of the leads 14, namely the first die pad 131 has substantially the same thickness as the leads 14. The thickness may be a thickness consistent with micro fabrication of the first die pad 131 and leads 14 (for example, the thickness may be about 0.2 millimeters ("mm")). In the description of some embodiments, when referring to two values or characteristics as being substantially the same or equal, the terms can refer to a first value or characteristic being precisely the same or equal to a second value or characteristic, as well as cases where the first value or characteristic is within a range of variation of less than or equal to ±5% of the second value or characteristic, such as less than or equal to ±4%, less than or equal to ±3%, less than or equal to ±2%, or less than or equal to ±1%.

As shown in FIG. 1B, the first die pad 131 is provided with or defines a cutout portion 131a. The cutout portion 131a can be formed by cutting out a portion of a side surface of the first die pad 131, or by cutting out a portion of a bottom surface of the first die pad 131. If a crack occurs in the interface between the first die pad 131 and a package material 12, the cutout portion 131a can suppress the crack from expanding inwardly in the semiconductor device 10, and thus improves the reliability of the semiconductor device 10.

The second die pad 132 is fixed on the top surface of the first die pad 131. The second die pad 132 can be made of a metal material having a superior thermal conductivity such as Cu or another appropriate metal or alloy, similarly to the first die pad 131. The first die pad 131 and the second die pad 132 can be made of a same metal material, or can be made of different metal materials.

Figure 2:
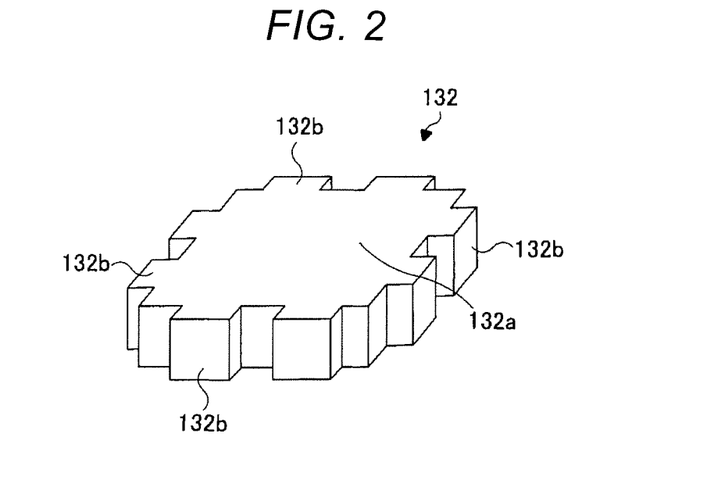
FIG. 2 is a perspective view showing a second die pad.

FIG. 2 is a perspective view showing the second die pad 132. Hereinafter, the second die pad 132 will be described with reference to FIG. 2.

As shown in FIG. 2, the second die pad 132 includes a body portion 132a and at least one protrusion portion 132b provided on a side surface of the body portion 132a. The body portion 132a can be formed of, for example, a metal, and may be in a rectangular plate shape. A plurality of protrusion portions 132b can be provided on the four side surfaces of the body portion 132a, and protrude away from the side surfaces. All the protrusion portions 132b can be integrally formed with the body portion 132a.

In the depicted embodiment, a thickness of at least one of the protrusion portions 132b can be substantially equal to a thickness of the body portion 132a, namely the protrusion portions 132b are substantially as thick as the body portion 132a. In some embodiments, the thickness of each of the protrusion portions 132b is substantially equal to the thickness of the body portion 132a. In such embodiments, there is substantially no step between the bottom surface of the body portion 132a and the bottom surface of each of the protrusion portions 132b and the both are arranged within the same plane.

Referring back to FIG. 1B, in the depicted embodiment, an area of the bottom surface of the second die pad 132 can be less than an area of the top surface of the first die pad 131. In the embodiment, the area of the bottom surface of the second die pad 132 means the sum of the area of the bottom surface of the body portion 132a and the area of the bottom surfaces of the plurality of protrusion portions 132b. In the depicted embodiment, the second die pad 132 does not protrude beyond the first die pad 131 in the horizontal direction.

The second die pad 132 configured as above is fixed to the top surface of the first die pad 131, for example, via an adhesive 15. The adhesive 15 can be made of, for example, a silver (Ag) paste or another conductive paste.

In the depicted embodiment, the second die pad 132 includes the plurality of protrusion portions 132b. The protrusion portions 132b can suppress the adhesive 15 from rising or creeping up the second die pad 132. As a result, more of a surface of the second die pad 132 may be exposed, in that it is not covered by the adhesive 15, and an adhesive property between the second die pad 132 and the package material 12 can be improved, hence improving the reliability of the semiconductor device 10. The above reason will be described below.

Consider a case where a second die pad formed exclusively of a body portion having the rectangular plate shape is fixed to the top surface of a first die pad with an adhesive. When there is an air layer between the second die pad and the first die pad, the thermal resistance between the second die pad and the first die pad rises. Therefore, a sufficient amount of adhesive is generally used in order to prevent formation of an air layer between the second die pad and the first die pad.

However, when such amount of adhesive is used, the adhesive may rise along the side surface of the second die pad and further up to the top surface of the second die pad. The adhesive further expands also in the curing process of curing the adhesive. Thus, a part of the side surface and the top surface of the second die pad is covered with the adhesive.

Here, as the adhesive, an Ag paste having a high thermal conductivity can be used and, as the package material, an epoxy resin generally containing a silica filler can be used; however, the adhesive property between these two materials may be poor.

In the case of using these general materials, when a part of the side surface and the top surface of the second die pad is covered by the adhesive, the second die pad is not well adhered to the package material. Rather, the package material is in contact with the adhesive which does not adhere well to the same package material. As a result, exfoliation occurs at the interface between the adhesive and the package material, which can reduce the reliability of the semiconductor device.

On the contrary, for the semiconductor device 10 according to the embodiment depicted in FIG. 1B, when the second die pad 132 includes the plurality of protrusion portions 132b, the adhesive 15 expands to the bottom surface of the protrusion portions 132b, which can suppress the adhesive 15 from rising along the side surfaces of the body portion 132a and the side surfaces of the protrusion portions 132b. Therefore, an interfacial area between the adhesive 15 and the package material 12 can be reduced and an adhered area of the second die pad 132 and the package material 12 can be enlarged, hence improving the reliability of the semiconductor device 10.

When the plurality of protrusion portions 132b are provided on each of the side surfaces of the body portion 132a, the adhesive 15 is further impeded from rising along the side surface of the body portion 132a between the adjacent protrusion portions 132b. Therefore, in some embodiments, it is desirable that each of the side surfaces of the body portion 132a is provided with the plurality of protrusion portions 132b.

In some embodiments, the second die pad 132 is thicker than at least the first die pad 131. By making the second die pad 132 thicker, the adhesive 15 can be suppressed from rising along the side surfaces to the top surface of the second die pad 132. Further, the first die pad 131 and the second die pad 132 can increase the volume of the whole die pad portion 13, thereby reducing an overall thermal resistance of the die pad portion 13.

In the embodiment depicted in FIG. 1B, the semiconductor chip 11 is mounted on the die pad portion 13 which includes the first die pad 131 and the second die pad 132 described above. The semiconductor chip 11 is mounted on the die pad portion 13, for example, with an adhesive 16 such as an Ag paste having a high thermal conductivity (FIG. 1B). The adhesive 16 and the adhesive 15 can include a same material, or can include different materials.

The semiconductor device 10 according to the first embodiment depicted in FIG. 1B is provided with a plurality of leads 14 having a thickness (for example, about 0.2 mm) suitable for micro fabrication.

As shown in FIGS. 1A and 1C, the plurality of leads 14 include a plurality of first leads 141 that are electrically independent of the first die pad 131, and a plurality of second leads 142 that are connected to drawing lines 17 extending from the first die pad 131. Drawing lines 17 may be considered to be a part of the first die pad 131, or may be integrally formed with the first die pad 131, or may be considered to be a part of the second leads 142, or may be integrally formed with the second leads 142.

The first leads 141 can be external input terminals for supplying signals and power to the semiconductor chip 11, or can be external output terminals for outputting signals supplied by the semiconductor chip 11 to the outside of the semiconductor device 10, or both.

The second leads 142 can be ground terminals for grounding the first die pad 131.

As shown in FIG. 1B, each of the leads 14 includes a cutout portion 14a. The cutout portions 14a can be formed by partially cutting out the side surface and the bottom surface in a similar manner to the first die pad 131. In other embodiments, a subset or none of the leads 14 include a cutout portion 14a. If a crack occurs in an interface between the lead 14 and the package material 12, the cutout portion 14a can suppress the crack from expanding inwardly in the semiconductor device 10, and thus can improve the reliability of the semiconductor device 10.

The leads 14 are arranged around the first die pad 131 so as to surround the first die pad 131, as shown in FIG. 10. The leads 14 are each electrically connected to the semiconductor chip 11 through wires 18. The wire 18 can be a metal conductive wire formed of, for example, gold (Au) or Cu.

In the semiconductor device 10 according to the first embodiment, the first die pad 131, the second die pad 132, the semiconductor chip 11, the leads 14, and the wires 18 are covered with the package material 12. The package material 12 covers the above-mentioned components but leaves a bottom surface of the first die pad 131 and bottom surfaces of the leads 14 exposed. The package material 12 can be formed of, for example, epoxy resin including a silica filler.

Figure 3A:
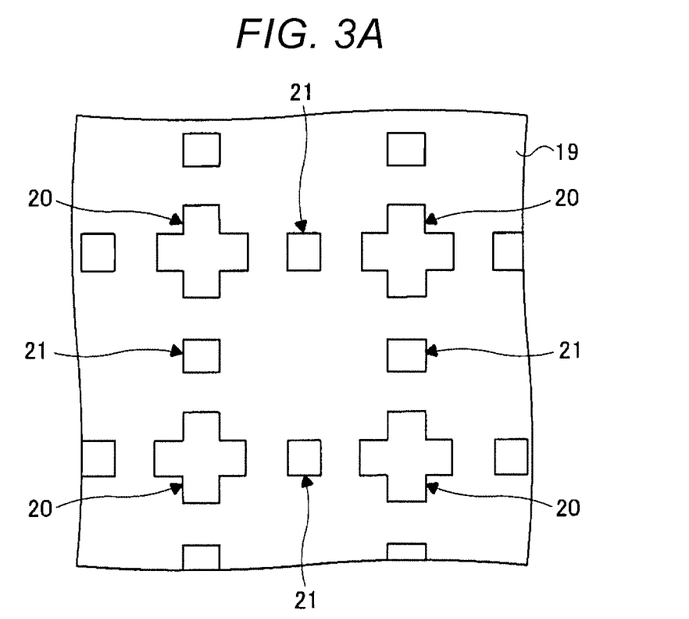
FIG. 3A is a top view for describing a method of manufacturing the second die pad.
Figure 3B:
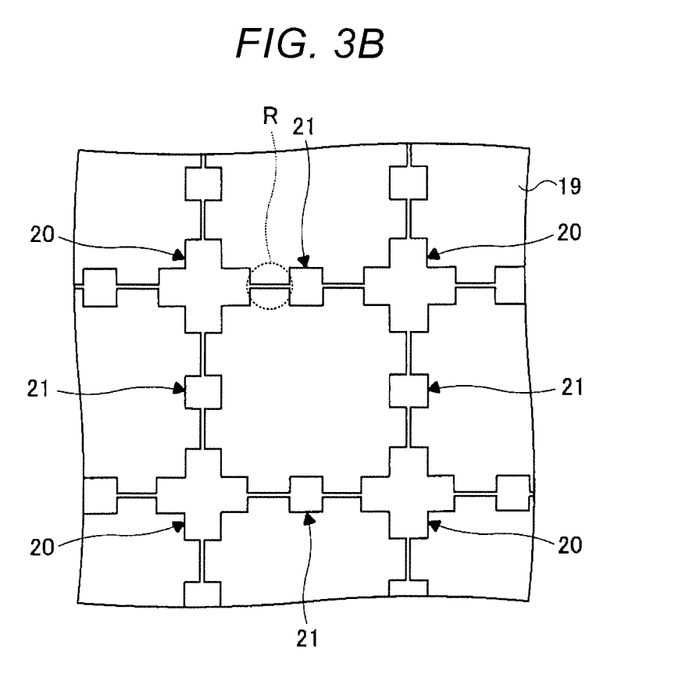
FIG. 3B is a top view for describing the method of manufacturing the second die pad.
Figure 4:
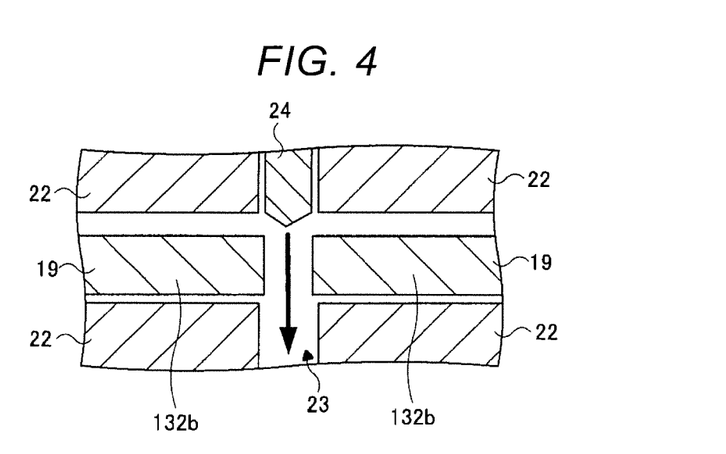
FIG. 4 is a partial cross-sectional view for describing the method of manufacturing the second die pad.

Next, an embodiment of a method of manufacturing the semiconductor device 10 will be described. The second die pad 132 can be manufactured first, and the manufactured second die pad 132 can be used to manufacture the semiconductor device 10. A method of manufacturing the second die pad 132 will be firstly described. FIGS. 3A and 3B are top views for describing the method of manufacturing the second die pad 132. FIG. 4 is a view for describing the method of manufacturing the second die pad and depicts a partial cross-sectional view for describing the process of cutting a region R of FIG. 3B.

As shown in FIG. 3A, cross-shaped through holes 20 and rectangular through holes 21 are alternatively arranged or provided in a metal plate 19. The metal plate may include, for example, a metal that is superior in thermal conductivity such as Cu.

Then, as shown in FIG. 3B, a portion of the metal plate 19 between the cross-shaped through holes 20 and the rectangular through holes 21 can be cut off or cut through. As shown in FIG. 4, in the cutting process, the metal plate 19 is sandwiched by metal mold 22 and then a blade 24 is slid along a blade guiding passage 23 formed in the metal mold 22 in a direction indicated by an arrow. Other embodiments may cut through the metal plate 19 in another appropriate manner.

According to the above, the second die pad 132 as shown in FIG. 2 can be manufactured.

Next, the method of manufacturing the semiconductor device 10 using the thus configured second die pad 132 will be described. FIGS. 5A to 5F are cross-sectional views corresponding to FIG. 1B, for describing the method of manufacturing the semiconductor device 10 according to the first embodiment.

Figure 5A:
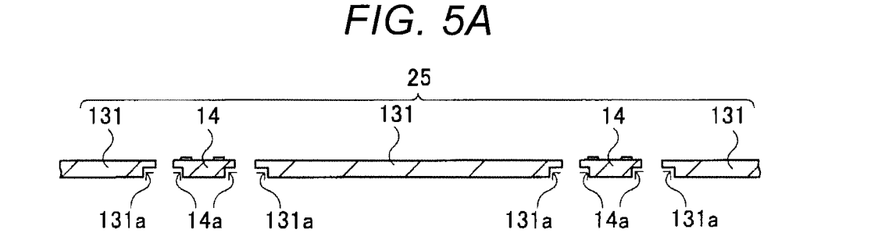
FIG. 5A is a cross-sectional view depicting a method of manufacturing the semiconductor device according to the first embodiment.

At first, for example, a metal plate formed of a metal material such as Cu is processed, and, as shown in FIG. 5A, a lead frame 25 integrally formed with a plurality of first die pads 131 and a plurality of leads 14 is formed. Here, the cutout portions 131a and 14a are also formed respectively in the first die pads 131 and the leads 14.

Figure 5B:
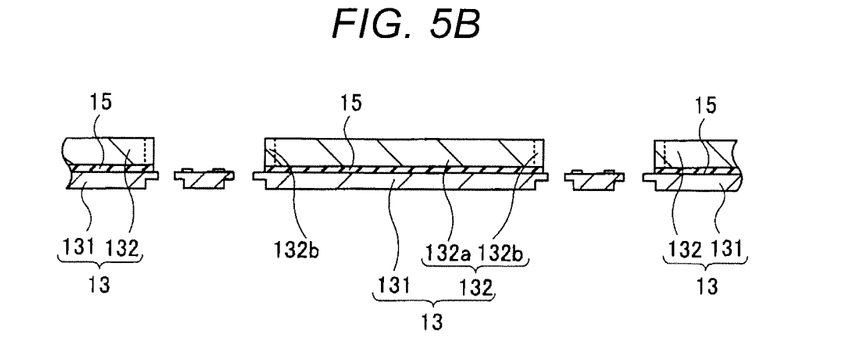
FIG. 5B is a cross-sectional view depicting a method of manufacturing the semiconductor device according to the first embodiment.

As shown in FIG. 5B, the adhesive 15 made of the Ag paste is applied to the top surfaces of the first die pads 131, and the second die pads 132, which have been separately manufactured, are arranged on or affixed to the top surfaces of the first die pads 131 via the adhesive 15. Then, the adhesive 15 is cured to fix the second die pads 132.

In this process, more adhesive 15 can be applied in order to suppress an air layer from forming between the first die pad 131 and the second die pad 132. In this embodiment, the second die pad 132 has the protrusion portions 132*b*, which can suppress the adhesive 15 from rising along the side surfaces of the body portion 132*a* and further up to the top surface of the second die pad 132.

Figure 5C:
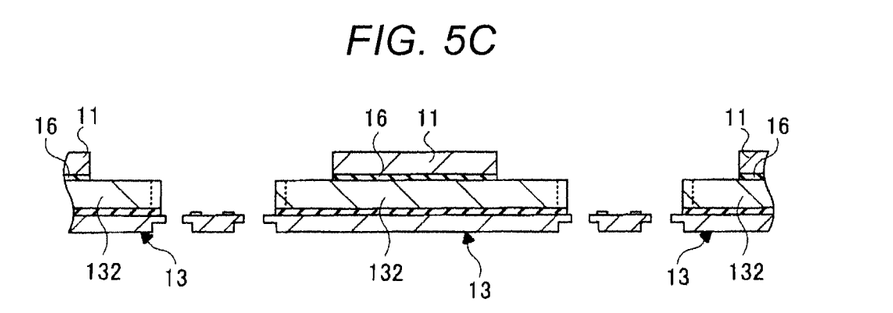
FIG. 5C is a cross-sectional view depicting a method of manufacturing the semiconductor device according to the first embodiment.

After forming the respective die pad portions 13, as shown in FIG. 5C, the adhesive 16 made of the Ag paste is applied to the top surfaces of the die pad portions 13 (the top surfaces of the second die pads 132), the semiconductor chips 11 are arranged on or affixed to the top surfaces of the die pad portions 13 (the top surfaces of the second die pads 132) via the adhesive 16. Thereafter, the adhesive 16 is cured to fix the semiconductor chips 11. According to this, the semiconductor chips 11 are mounted on the top surfaces of the respective die pad portions 13 (the top surfaces of the respective second die pads 132).

Figure 5D:
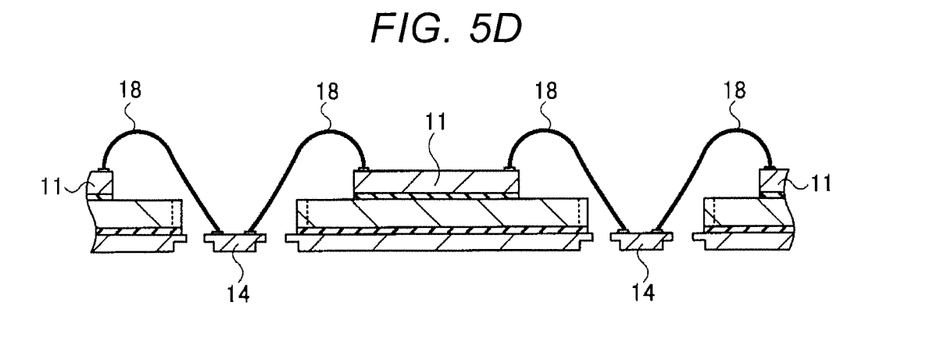
FIG. 5D is a cross-sectional view depicting a method of manufacturing the semiconductor device according to the first embodiment.

As shown in FIG. 5D, the wires 18 made of, for example, Au or Cu are connected to the semiconductor chips 11 and the leads 14 to electrically connect the semiconductor chips 11 and the leads 14.

Figure 5E:
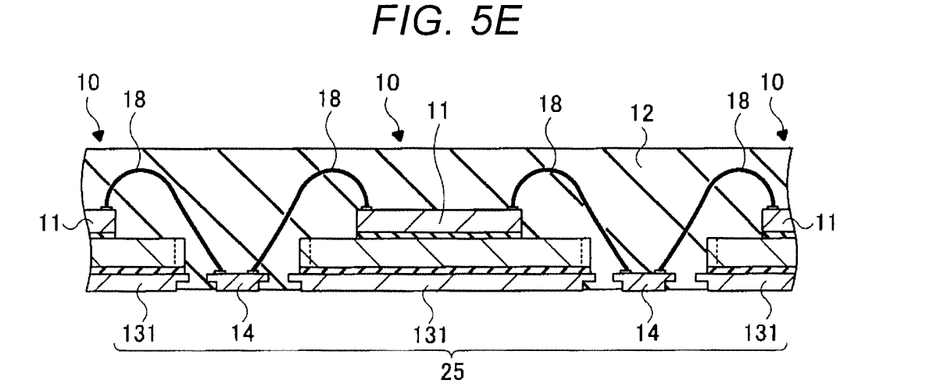
FIG. 5E is a cross-sectional view depicting a method of manufacturing the semiconductor device according to the first embodiment.

As shown in FIG. 5E, the lead frame 25, the plurality of semiconductor chips 11, and the plurality of wires 18 are covered with the package material 12 formed of, for example, epoxy resin including a silica filler, leaving at least a portion of the bottom surface of the lead frame 25 exposed. According to this, the plurality of semiconductor devices 10 integrated with the lead frame 25 and the package material 12 are manufactured.

Figure 5F:
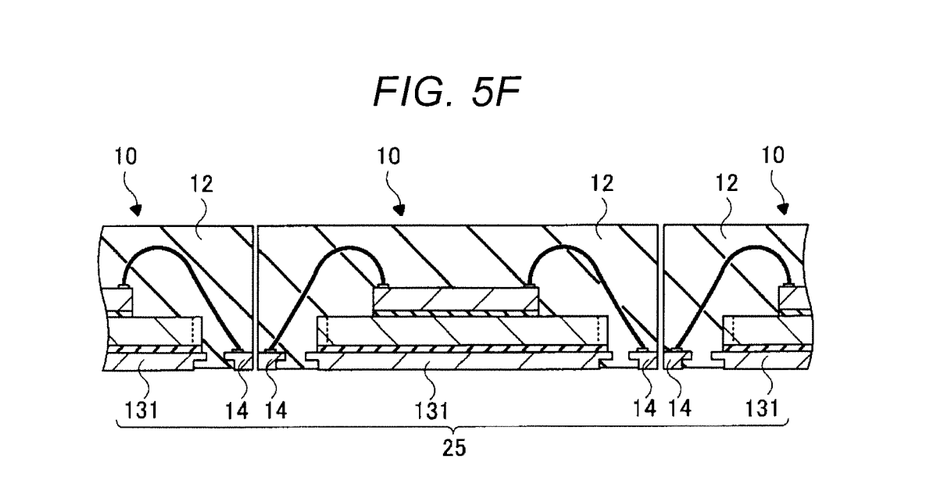
FIG. 5F is a cross-sectional view depicting a method of manufacturing the semiconductor device according to the first embodiment.

At the end, as shown in FIG. 5F, the package material 12 between the semiconductor devices 10 and the lead frame 25 between the leads 14 are cut off into the individual integrated semiconductor devices 10.

According to the above, the semiconductor device 10 in the first embodiment can be manufactured. These steps need not necessarily be performed in the sequence laid out above, and certain steps may be performed concurrently or in a different order, as appropriate.

According to the above mentioned first embodiment, with the die pad portion 13 formed by the first die pad 131 and the second die pad 132, the semiconductor device 10 having a good heat radiation property can be provided.

Further, according to the first embodiment, with the protrusion portions 132*b* provided on the side surfaces of the body portion 132*a* of the second die pad 132, the adhesive 15, which is used to affix the second die pad 132 to the first die pad 131, can be suppressed from covering a part of the side surfaces and the top surface of the second die pad 132. As the result, the adhesion between the second die pad 132 and the package material 12 can be improved and the semiconductor device 10 superior in the reliability can be provided.

Second Embodiment

Figure 6:
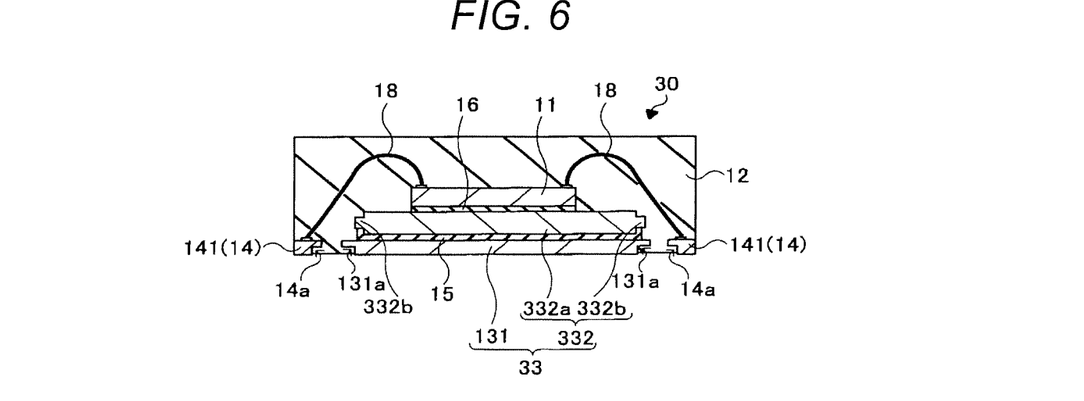
FIG. 6 is a cross-sectional view of a semiconductor device according to a second embodiment.
Figure 7:
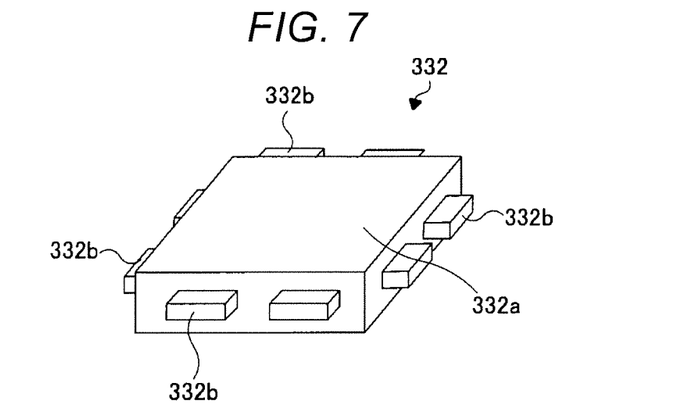
FIG. 7 is a perspective view showing a second die pad.

FIG. 6 is a cross-sectional view corresponding to FIG. 1B, in a semiconductor device according to a second embodiment. FIG. 7 is a perspective view showing a second die pad used for the semiconductor device according to the second embodiment. Hereinafter, with reference to FIGS. 6 and 7, the semiconductor device according to the second embodiment will be described. The top view of the semiconductor device according to the second embodiment is similar in some ways to the top view depicted in FIG. 1A and the bottom view of the semiconductor device according to the second embodiment is similar in some ways to the bottom view depicted in FIG. 1C. Therefore, top and bottom view drawings corresponding to the second embodiment of the semiconductor device are omitted. In the following description, some components of the second embodiment can be similarly configured as those described above in reference to the first embodiment of the semiconductor device or in reference to the above described manufacturing methods. Those components are referred to below by the same reference numbers as they are referred to above, and further description of those components may be omitted in the below description.

The semiconductor device 30 according to the second embodiment is different from the semiconductor device 10 according to the first embodiment in the structure of the second die pad 332 forming the die pad portion 33. Hereinafter, the second die pad 332 in the semiconductor device 30 according to the second embodiment will be described.

As shown in FIGS. 6 and 7, in the semiconductor device 30 according to the second embodiment, each protrusion portion 332*b* of the second die pad 332 is thinner than the rectangular plate shaped body portion 332*a*. In other embodiments, one or more, but not all, of the protrusion portions 332*b* are thinner than the rectangular plate shaped body portion 332*a*. The protrusion portions 332*b* are provided on each of the side surfaces of the body portion 332*a* so as to form steps between the bottom surfaces of the protrusion portions 332*b* and the bottom surface of the body portion 332*a*. In other words, the bottom surfaces of the protrusion portions 332*b* and the bottom surface of the plate shaped body portion 332*a* are not coplanar.

The second embodiment of the semiconductor device 30 can be similar to the first embodiment of the semiconductor device 10 in some ways, such as in that the second die pad 332 is formed so as to not protrude from the first die pad 131, and the second die pad 332 does not extend beyond the first die pad 131 in a horizontal direction.

The second die pad 332 and the semiconductor device 30 according to the second embodiment can be manufactured in a manner similar to the manufacturing method described above in reference to the first embodiment.

According to the above mentioned second embodiment of the semiconductor device 30, similarly to the first embodiment, with the die pad portion 33 formed by the first die pad 131 and the second die pad 332, the semiconductor device 30 having a good heat radiation property can be provided.

Further, according to the second embodiment, the protrusion portions 332*b* are provided on the side surfaces of the body portion 332*a* of the second die pad 332. The protrusion portions 332*b* can suppress the adhesive 15 creeping up or advancing up along the side surface of the body portion 332*a* and arriving at the top surface of the second die pad 332. As a result, adhesion between the second die pad 332 and the package material 12 can be improved and the semiconductor device 30 superior in the reliability can be provided.

Further, according to the second embodiment, adhesion between the first die pad 131 and the second die pad 332 through the adhesive 15 can be improved, and the semiconductor device 30 having the improved heat radiation property can be provided. This reason will be described below.

Figure 8:
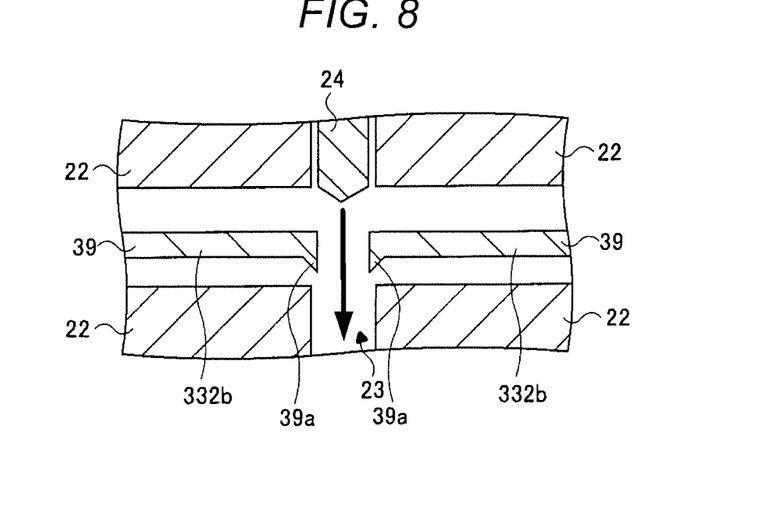
FIG. 8 is a partial cross-sectional view depicting a method of manufacturing the second die pad.

FIG. 8 is a partial cross-sectional view corresponding to FIG. 4, for describing the method of manufacturing the second die pad 332 in the semiconductor device 30 according to the second embodiment. As shown in FIG. 8, the second die pad 332 is manufactured by cutting the metal plate 39 that becomes the second die pad 332 with the blade 24, and a portion of metal pushed down by the blade 24 during the cutting process can remain on and protrude downwardly from a bottom surface of the portion that becomes the protrusion portion 332b. This downwardly protruding portion of the protrusion portion 332b will be referred to as "burr 39a". Here, protruding downwardly may refer to a direction from the second die pad 332 toward the first die pad 131. In a case where the protrusion portion 332b is thinner than the body portion 332a, with a step formed between the bottom surface of the protrusion portion 332b and the bottom surface of the body portion 332a, such as a case involving the second embodiment of the semiconductor device 30, even when the "burr 39a" is formed as illustrated, the step can suppress the burr 39a from protruding below or beyond the bottom surface of the body portion 332a. Therefore, the first die pad 131 and the second die pad 332 can be adhered to each other via the adhesive 15 without a burr 39a physically interfering. As a result, the heat radiation property of the semiconductor device 30 can be further improved.

In other cases where the protrusion portion 132b is substantially as thick as the body portion 132a without any step between the bottom surface of the protrusion portions 132b and the bottom surface of the body portion 132a, such as cases involving the second die pad 132 in the semiconductor device 10 according to the first embodiment, the burr 39a formed in the protrusion portion 132b may protrude below the bottom surface of the body portion 132a. Therefore, the burr 39a may be more prone to disturbing an adhesion between the first die pad 131 and the second die pad 132.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure. Moreover, some or all of the above described embodiments can be combined when implemented.

Figure 9A:
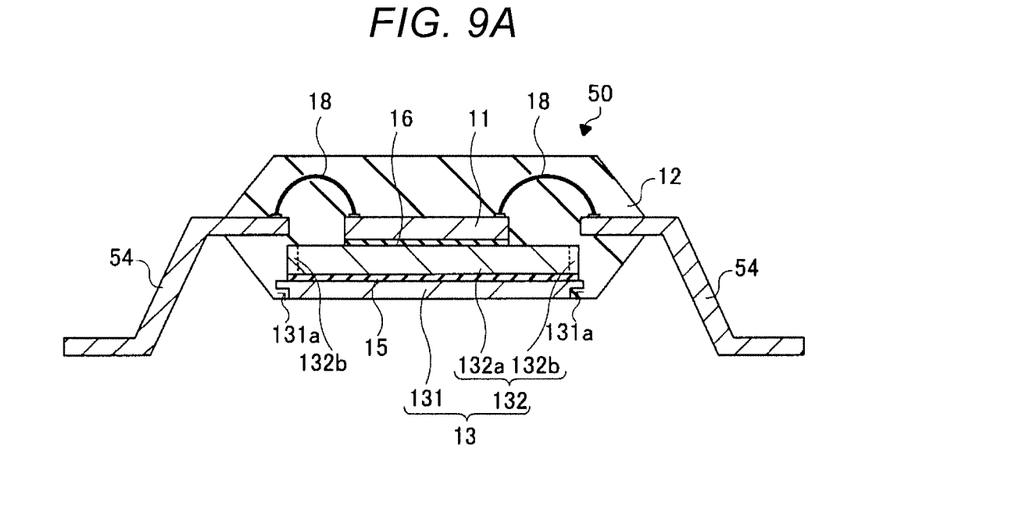
FIG. 9A is a cross-sectional view showing a semiconductor device according to another embodiment.
Figure 9B:
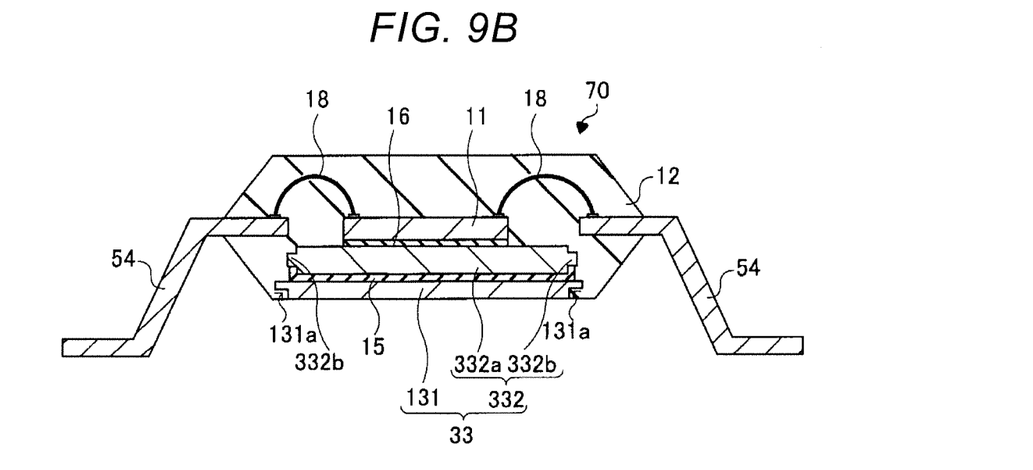
FIG. 9B is a cross-sectional view showing a semiconductor device according to another embodiment.

For example, the semiconductor devices 10 and 30 according to the above embodiments are so-called Quad Flat Non-lead package (QFN) typed semiconductor devices, with a plurality of leads 14 exposed from the bottom surface. However, the structure of the die pad portion 13 having been described in the first embodiment and the structure of the die pad portion 33 having been described in the second embodiment may be used for so called Quad Flat Package (QFP) typed semiconductor devices 50 and 70 with a plurality of leads 54 protruding from lateral or side surfaces, as shown in FIGS. 9A and 9B. In FIG. 9A, the same reference numbers are attached to the same components as the semiconductor device 10 according to the first embodiment, and in FIG. 9B, the same reference numbers are attached to the same components as the semiconductor device 30 according to the second embodiment.

What is claimed is:
1. A semiconductor device comprising:
a first die pad;
an adhesive;
a second die pad fixed to a top surface of the first die pad via the adhesive, the second die pad including a body portion and a protrusion portion provided on a side surface of the body portion;
a semiconductor chip fixed to a top surface of the second die pad such that the second die pad is disposed between the semiconductor chip and the first die pad;
a lead electrically connected to the semiconductor chip; and
a package material that covers the first die pad, the second die pad, the semiconductor chip, and the lead, wherein the first die pad is substantially as thick as the lead.

2. The device according to claim 1, wherein the body portion of the second die pad includes a plurality of side surfaces including the side surface, and each of the side surfaces is provided with a plurality of protrusion portions.

3. The device according to claim 1, wherein the body portion of the second die pad is thicker than the first die pad.

4. The device according to claim 1, wherein a thickness of the protrusion portion is substantially equal to a thickness of the body portion.

5. The device according to claim 1, wherein the protrusion portion is thinner than the body portion.

6. The device according to claim 1, wherein the first die pad defines a cutout portion.

7. The device according to claim 1, wherein the lead defines a cutout portion.

8. The device according to claim 1, wherein the lead protrudes from a side surface of the package material.

9. The device according to claim 1, wherein the adhesive is a conductive paste.

10. The device according to claim 9, wherein the conductive paste is a silver paste.

11. The device according to claim 1, wherein a bottom surface of the lead is exposed from the package material.

12. A method of manufacturing a semiconductor device, the method comprising:
providing a lead frame including a first die pad and a plurality of leads;
affixing a second die pad on a top surface of the first die pad via an adhesive, the second die pad including a body portion and a protrusion portion extending from a side surface of the body portion;
affixing a semiconductor chip to a top surface of the second die pad such that the second die pad is disposed between the semiconductor chip and the first die pad;
electrically connecting the semiconductor chip and the leads; and
covering the lead frame, the second die pad, and the semiconductor chip with a package material.

13. The method according to claim 12, wherein the body portion of the second die pad is thicker than the first die pad.

14. The method according to claim 12, wherein the protrusion portion is thinner than the body portion.

15. The method according to claim 12, wherein the adhesive is a conductive paste.

16. The method according to claim 12, wherein covering the lead frame with the package material is such that a bottom surface of the first die pad is exposed from the package material.

17. A semiconductor device comprising:
a first die pad;
an adhesive;
a second die pad fixed to a top surface of the first die pad via the adhesive, the second die pad including a body portion and a protrusion portion provided on a side surface of the body portion;

a semiconductor chip fixed to a top surface of the second die pad;
a lead electrically connected to the semiconductor chip; and
a package material that covers the first die pad, the second die pad, the semiconductor chip, and the lead, wherein
the first die pad is substantially as thick as the lead;
the body portion of the second die pad includes a plurality of side surfaces including the side surface; and
each of the side surfaces is provided with a plurality of protrusion portions.

\* \* \* \* \*